(12) United States Patent
Lee et al.

(10) Patent No.: US 9,674,969 B2
(45) Date of Patent: Jun. 6, 2017

(54) FLEXIBLE PRINTED CIRCUIT BOARD AND MANUFACTURING METHOD THEREOF

(71) Applicant: Samsung Electro-Mechanics Co., Ltd., Suwon-si (KR)

(72) Inventors: Chang-Jae Lee, Busan (KR); Tae-Ho Ko, Busan (KR); Jun-Ho Kang, Busan (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/966,099

(22) Filed: Dec. 11, 2015

(65) Prior Publication Data

US 2016/0183363 A1  Jun. 23, 2016

(30) Foreign Application Priority Data

Dec. 17, 2014 (KR) ........................ 10-2014-0182500

(51) Int. Cl.
| | |
|---|---|
| H05K 1/02 | (2006.01) |
| H05K 3/00 | (2006.01) |
| H05K 1/03 | (2006.01) |
| H05K 1/09 | (2006.01) |
| H05K 1/11 | (2006.01) |
| B23K 26/364 | (2014.01) |
| H05K 3/46 | (2006.01) |
| B23K 26/06 | (2014.01) |
| B23K 26/362 | (2014.01) |
| H05K 1/18 | (2006.01) |

(52) U.S. Cl.
CPC ....... *H05K 3/4691* (2013.01); *B23K 26/0661* (2013.01); *B23K 26/362* (2013.01); *H05K 3/4697* (2013.01); *H05K 1/183* (2013.01); *H05K 2201/0154* (2013.01); *H05K 2203/107* (2013.01)

(58) Field of Classification Search
USPC .................................................. 174/378, 254
See application file for complete search history.

(56) References Cited

U.S. PATENT DOCUMENTS

| | | | | |
|---|---|---|---|---|
| 4,931,134 A * | 6/1990 | Hatkevitz | ............ | H05K 3/0035 156/150 |
| 5,206,463 A * | 4/1993 | DeMaso | .............. | H05K 3/4691 174/254 |
| 6,288,343 B1 * | 9/2001 | Ahn | ...................... | H05K 3/4691 174/254 |
| 8,609,991 B2 * | 12/2013 | Takahashi | .............. | H05K 1/183 174/254 |
| 2008/0047737 A1 * | 2/2008 | Sahara | .................. | H05K 1/186 174/254 |

(Continued)

FOREIGN PATENT DOCUMENTS

JP 2007-266195 * 10/2007

*Primary Examiner* — Michael F McAllister
(74) *Attorney, Agent, or Firm* — NSIP Law

(57) ABSTRACT

A flexible printed circuit board and a method of manufacturing the same are disclosed. A flexible printed circuit board having a flexible region and a rigid region includes an inner board layer, an outer board layer laminated on the inner board layer and having a cavity formed in the rigid region, and a laminate exposing a pad in the cavity and laminated on the inner board layer in the rigid region where the pad is formed. The laminate includes a coverlay layer and a copper foil layer arranged so that the coverlay layer faces the inner board layer.

8 Claims, 4 Drawing Sheets

(56) References Cited

U.S. PATENT DOCUMENTS

2009/0229876 A1\* 9/2009 Takahashi ............ H05K 3/4691
174/378
2010/0025087 A1\* 2/2010 Takahashi ............ H05K 3/4691
174/254

\* cited by examiner

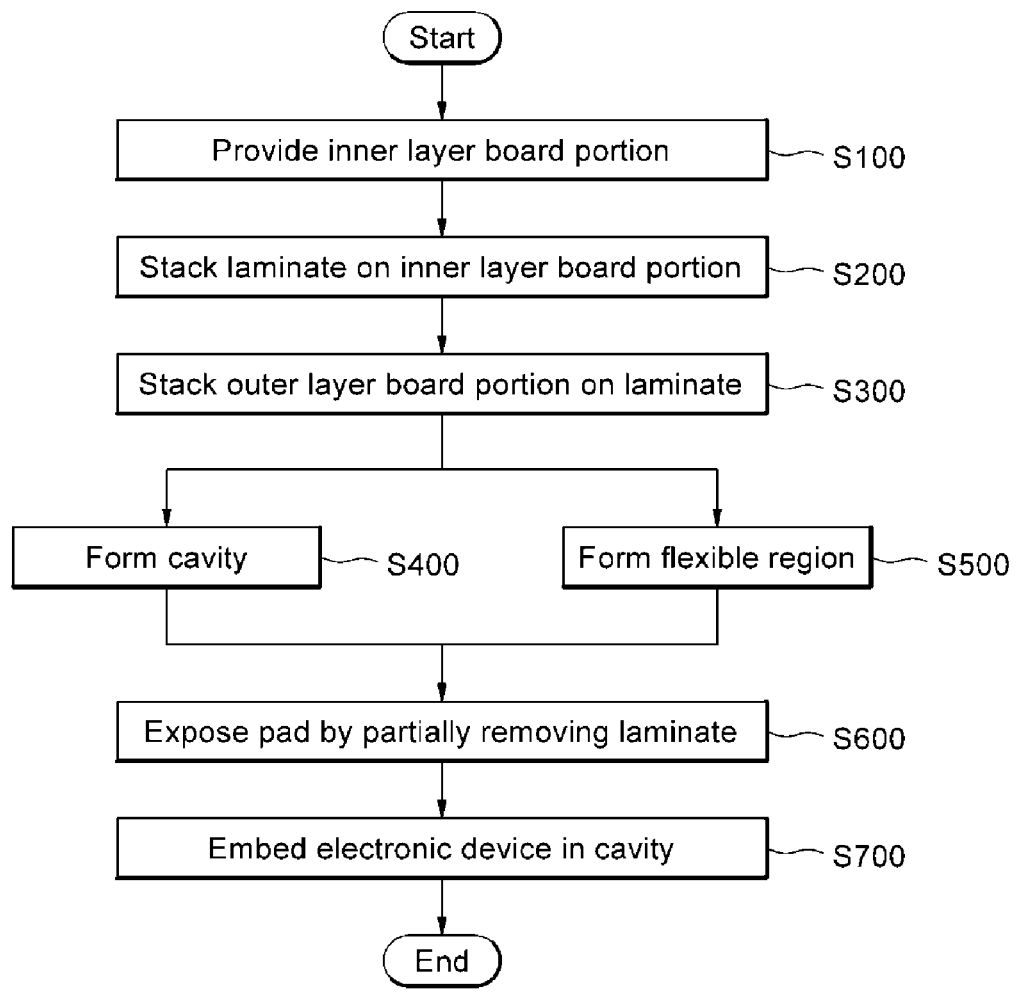
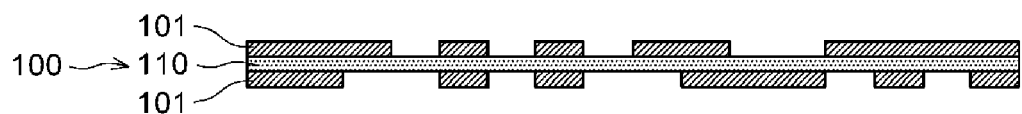

FLEXIBLE PRINTED CIRCUIT BOARD AND MANUFACTURING METHOD THEREOF

CROSS-REFERENCE TO RELATED APPLICATIONS

This application claims the benefit under 35 USC 119(a) of Korean Patent Application No. 10-2014-0182500, filed on Dec. 17, 2014, in the Korean Intellectual Property Office, the entire disclosure of which is incorporated herein by reference for all purposes.

BACKGROUND

1. Field

The following description relates to a flexible printed circuit board and a method of manufacturing the flexible printed circuit board.

2. Description of Related Art

Electronic products are becoming increasingly smaller and thinner, as well as being designed to have specific aesthetically pleasing external appearances. To implement electronic products that meet all of these requirements, the size and shape of printed circuit boards (PCBs) that are inserted into the electronic products have to be also designed to meet rigid specifications.

According to the number of layers, printed circuit boards may be classified as single side PCBs, in which wiring is formed on one side of an insulation layer only, double side PCBs, in which wiring is formed on both sides of an insulation layer, and multi-layered PCBs, in which wiring is formed on multiple layers.

According to a material used therein, PCBs may be classified as rigid PCBs, which use a rigid material, flexible PCBs, which use a flexible material, and rigid flexible PCBs, which use a combination of a rigid material and a flexible material.

Among these different types of PCBs, flexible PCBs are increasingly used as the boards that are inserted in electronic products in order to cope with the increasing demand for smaller and thinner electronic products. Moreover, in addition to smartphones and tablet PCs having various functions, an increasing number of watch-type, bracelet-type and necklace-type wearable products have been developed, requiring various structures and designs of circuit boards that are capable of realizing these wearable products. Examples of these PCBs are disclosed, for example, in Korea Patent Publication No. 10-2013-0097473 (laid open on Sep. 3, 2013).

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a flexible printed circuit board having a flexible region and a rigid region, including an inner board layer, an outer board layer laminated on the inner board layer and having a cavity formed in the rigid region, and a laminate exposing a pad in the cavity and laminated on the inner board layer in the rigid region where the pad is formed, in which the laminate includes a coverlay layer and a copper foil layer arranged so that the coverlay layer faces the inner board layer.

The laminate may be laminated continuously on the inner board layer in the rigid region where the pad is formed.

The general aspect of the flexible printed circuit board may further include an electronic device embedded in the cavity and electrically connected to the pad.

The electronic device may include a terminal formed at a portion thereof, and the terminal may be electrically connected with the pad through a contact.

The inner board layer may include a first insulation layer and an inner circuit layer formed on at least one face of the first insulation layer, and the outer board layer may include a second insulation layer laminated on the inner board layer and an outer circuit layer formed on the second insulation layer.

The flexible region may include at least a portion of the first insulation layer and at least a portion of the inner circuit layer.

The coverlay layer may include a polyimide film and a thermosetting adhesive.

The cavity may be formed by removing a portion of the outer board layer through etching and laser processing, and the laser processing may be performed by using a portion of the copper foil layer of the laminate as a laser mask.

The flexible region may be formed by removing portions of the outer board layer laminated on the inner board layer and the laminate through etching and laser processing.

In another general aspect, a method of manufacturing a flexible printed circuit board having a flexible region and a rigid region involves providing an inner board layer, forming a laminate comprising a coverlay layer and a copper foil layer on the inner board layer such that the coverlay layer faces the inner board layer, forming an outer board layer on the laminate, forming a cavity by removing a portion of the outer board layer in the rigid region, and exposing a pad by removing a portion of the laminate in the cavity.

The general aspect of the method may further involve, after the exposing of the pad, embedding an electronic device in the cavity for electrical connection to the pad.

The forming of the cavity may be performed by removing a portion of the outer board layer through etching and laser processing by using a portion of the copper foil layer of the laminate as a laser mask.

The general aspect of the method may further involve, after the laminating of the outer board layer, forming the flexible region such that a portion of the inner board layer is exposed.

The forming of the flexible region may be performed by removing portions of the outer board layer and the laminate laminated on the inner board layer through etching and laser processing.

In another general aspect, a method of manufacturing a printed circuit board involves forming a coverlay layer on an inner board layer, laminating a foil layer over the coverlay layer and the inner board layer, forming an outer board layer on the copper foil layer, and forming a flexible region of the printed circuit board by removing a portion of the outer board layer to form a cavity above the inner board layer.

The inner board layer may include a first insulation layer and an inner circuit layer.

The general aspect of the method may further involve forming a pad by removing a portion of the foil layer inside the cavity.

The general aspect of the method may further involve, after the forming of the pad, disposing an electronic device in the cavity.

The general aspect of the method may further involve forming a via in the inner board layer before the forming of the coverlay layer on the inner board layer.

The forming of the via may involve forming a via hole in the inner board layer, depositing a film of a conductive material over a bottom surface and a side surface of a via hole with a conductive material, and filling the via hole with a conductive metal before the forming of the coverlay.

Other features and aspects will be apparent from the following detailed description, the drawings, and the claims.

BRIEF DESCRIPTION OF DRAWINGS

FIG. 2 is a flow diagram illustrating an example of a method of manufacturing a flexible printed circuit board.

FIG. 3, FIG. 4, FIG. 5, FIG. 6, FIG. 7 and FIG. 8 illustrate examples of processes of a method of manufacturing a flexible printed circuit board according to one example of the present disclosure.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
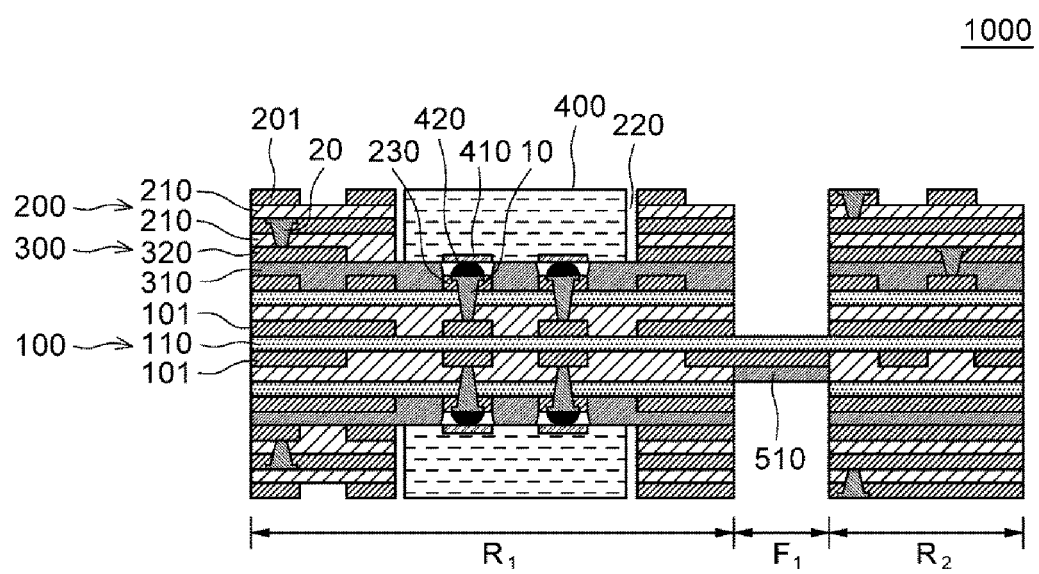
FIG. 1 illustrates an example of a flexible printed circuit board according to the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, various example of flexible printed circuit boards and manufacturing methods thereof will be described with reference to the accompanying drawings. In describing the various examples with reference to the accompanying drawings, any identical or corresponding elements will be assigned with same reference numerals, and their description will not be provided redundantly.

When one element is described to be "coupled" to another element, it does not refer to a physical, direct contact between these elements only, but it shall also include the possibility of yet another element being interposed between these elements and each of these elements being in contact with said yet another element.

An example of a flexible printed circuit board in accordance with the present disclosure uses a laminate obtained by having a coverlay layer and a copper foil layer laminated for one of rigid regions to laminate the laminate on a pad exposed through a cavity.

FIG. 1 illustrates an example of a flexible printed circuit board in accordance with the present disclosure.

Referring to FIG. 1, a flexible printed circuit board 1000 includes an inner board layer 100, an outer board layer 200 and a laminate 300, and may further include an electronic device 400.

The flexible printed circuit board 1000 in accordance with the example illustrated in FIG. 1 includes a flexible region F1 and a rigid regions R1, R2. In this example, the flexible region F1 is a region that is more flexible in comparison to the rigid regions R1, R2 in the flexible printed circuit board 1000; thus, the flexible region F1 may be deformed relatively flexibly by warpage. The flexible region F1 may be formed by having a first insulation layer 110 and an inner circuit layer 101, which extend from either the rigid region R1, the rigid region R2 or both. As illustrated, the inner circuit layer 101 of the flexible region F1 may be further covered by a separate coverlay layer 510. The inner circuit layer 101 will be further described later.

The rigid regions R1, R2, which are remaining regions excluding the flexible region F1, form a build-up layer by having one or more of the outer board layer 200 and the laminate 300 laminated on the inner board layer 100 and may be deformed relatively limitedly by warpage. That is, the rigid regions R1, R2 require a greater stress to bend to the same degree, in comparison to the flexible region F1.

In the illustrated example, the inner board layer 100, which is formed throughout the flexible region F1 and the rigid regions R1, R2, may form a core in the flexible printed circuit board 1000. For example, the inner board layer 100 may be a laminated plate, such as a flexible copper clad laminate (FCCL), in which a copper foil is laminated on at least one face of the polyimide-based, first insulation layer 110.

Moreover, the inner board layer 100 may have the inner circuit layer 101 formed therein by processing, for example, exposing and etching, the copper foil laminated on at least one face of the first insulation layer 110. For instance, the inner circuit layer 101 may be formed by a subtractive process, an additive process or a modified semi additive process, depending on the manufacturing process.

When forming the inner circuit layer 101, an interconnection may be made by forming a through-hole having an inner wall thereof plated in the first insulation layer 110 for electrical connection between both faces of the first insulation layer 110.

The outer board layer 200, which is laminated on the inner board layer 100 and has a cavity 220 formed in a portion of the rigid regions R1, R2, forms the build-up layer in the rigid regions R1, R2. The outer board layer 200 may be formed into a plurality of layers by coating an adhesive material and then compressing a second insulation layer 210, for example, a prepreg, and the copper foil repeatedly.

In addition, the outer board layer 200 may have an outer circuit layer 201 formed therein by use of an etching process using photolithography or an additive process (plating process). In such a case, the outer circuit layer 201 may be connected with another outer circuit layer 210 formed on another layer and with the inner circuit layer 101 through a via 20 penetrating the second insulation layer 210; however, it shall be appreciated that the present disclosure is not restricted to what is described herein, and various modifications may be made as necessary.

The cavity 220, which is a space for installing the electronic device 400 installed in the outer board layer 200, may be formed by use of a punching technique using a CNC drill or a mold or a technique using a laser drill ($CO_2$ or YAG).

The laminate 300, which exposes a pad 230 formed in the cavity 220 and is laminated on a layer of the rigid regions R1, R2 where the pad 230 is formed, may function as a solder resist for protecting the pad 230. For example, the laminate 300 may be continuously laminated throughout the layer of the rigid regions R1, R2 where the pad 230 is formed.

In such a case, the pad 230 becomes a conductor portion that is electrically connected with the electronic device 400, which will be described later, and may be a part of the outer circuit layer 201. Moreover, the pad 230 may be connected with the inner circuit layer 101 and/or an outer circuit layer 201 formed on another layer through, for example, a via 10.

To increase the reliability of the via 10 or via 20, a bottom surface and side surfaces of a via hole may be covered with a thin film of a conductive material before the via hole is filled with a conductive material to form the via 10 or via 20.

Referring to the example of the flexible printed circuit board 1000 illustrated in FIG. 1, the laminate 300 is formed by having a coverlay layer 310 and a copper foil layer 320 laminated thereon, the coverlay layer 310 being laminated so as to be oriented toward the inner board layer 100. Further, a portion the laminate 300 where the cavity 220 is formed is partially removed so as to expose the pad 230.

That is, the coverlay layer 310 and the copper foil layer 320 are laminated to form a single modularized laminate 300, and the coverlay layer 310 of this laminate 300 is laminated so as to cover the pad 230.

The coverlay layer 310 is a composite film layer having a thermosetting flame-resistant epoxy adhesive coated on a polyimide film and may cover and protect the pad 230 exposed through the cavity 220. The outer circuit layer 201, which forms a particular layer in the build-up layer, may be formed by processing the copper foil layer 320 laminated on the coverlay layer 310.

In such a case, the electronic device 400 may be electrically connected to the pad 230 by having the laminate 300 partially removed, for example, by removing the copper foil layer 320 at a portion of the laminate 300 where the cavity is formed and by removing a portion of the coverlay layer 310 corresponding to a width of the pad 230 so as to allow the pad 230 to be exposed.

Although FIG. 1 illustrates an example of a configuration in which the second insulation layer 210 and the outer circuit layer 201 are laminated on the inner board layer 100, and in which the laminate 300 is laminated on an upper surface of the outer circuit layer 201, and in which the outer board layer 200 is laminated on an upper surface of the laminate 300. However, the present invention shall not be limited to what is illustrated herein; the location of the layer where the laminate 300 is laminated in the rigid regions R1, R2 may vary according to the location where the cavity 220 and the pad 230 are formed.

As described above, the example of the flexible printed circuit board 1000 illustrated in FIG. 1 uses the modularized laminate 300 for one of the layers of the rigid regions R1, R2 to allow the laminate 300 to be laminated on the pad 230 exposed through the cavity 220; thus, the flexible printed circuit board 1000 may be manufactured in a simplified process.

For example, in the case where the build-up layer is formed by repeatedly laminating the prepreg and the copper foil only, a separate coverlay processed to fit with the shape of the cavity 220 needs to be tack-welded and molded on the pad 230, and the prepreg and the copper foil need to be laminated on the coverlay.

Because it may be difficult to coat PSR ink in the cavity 220 during a finishing process of the cavity 220 due to a stepped difference, the separate coverlay would need to be laminated on the pad 230 through an additional process.

However, in another example of the flexible printed circuit board 1000 in accordance with the present disclosure, the above-described processes of fabricating, tack-welding and molding the separate coverlay may be skipped, by using the modularized laminate 300 for one of the layers of the rigid regions R1, R2 to laminate the laminate 300 on the pad 230 exposed through the cavity 220.

Moreover, as the modularized laminate 300 is used as a part of the build-up layer, the build-up layer may have an improved inter-layer matching and may be relatively thinner.

The electronic device 400, which is a portion that is embedded in the cavity 220 and is electrically connected with the pad 230, may be an active device, such as an IC chip, or a passive device, such as a capacitor and an inductor. The electronic device 400 may have a terminal 410 formed thereon for electrical connection with the pad 230. The terminal 410 may be electrically connected with the pad 230 through a separate contact, such as a solder ball.

By forming the cavity 220 in a portion of the outer board layer 200 and mounting the electronic device 400 in the cavity 220, it is possible to manufacture a smaller and thinner electronic product using a flexible printed circuit board 1000 having the above described structure.

According to one example of the flexible printed circuit board 1000 in accordance with the present disclosure, the cavity 220 may be formed by removing portions of the outer board layer 200 by use of etching and laser processing. For example, the laser processing may be performed by using a portion of the copper foil layer 320 of the laminate 300 as a laser mask.

The laser mask is a portion that performs a laser resist function during the laser processing and may protect a portion covered by the laser mask because the laser mask is not removed during the laser processing.

Meanwhile, as the copper foil layer 320 of the laminate 300 is not removed by the laser processing, the copper foil layer 320 itself may function as the laser mask.

Accordingly, since the flexible printed circuit board 1000 in accordance with the present disclosure may be manufactured without forming an additional laser resist layer, but may instead use a portion of the copper foil layer 320 as the laser mask, the flexible printed circuit board 1000 may be manufactured through a simplified process.

An example of using a portion of the copper foil layer 320 as the laser mask will be described in a greater detail below in reference to a method of manufacturing a flexible printed circuit board.

According to one example of the flexible printed circuit board 1000 in accordance with the present disclosure, the flexible region F1 may be formed by removing portions of the outer board layer 200 and the laminate 300 laminated on the inner board layer 100 by use of etching and laser processing.

That is, as shown in FIG. 1, the outer board layer 200 and the laminate 300 corresponding to the flexible region F1 are removed in order to form a structure in which the inner board layer 100 is exposed in the flexible region F1.

For this, the copper foil of the outer board layer 200 and the copper foil layer 320 of the laminate 300 may be each removed by etching, and the second insulation layer 210 of the outer board layer 200 and the coverlay layer 310 of the laminate 300 may be each removed by laser processing.

In such a case, the process of forming the flexible region F1 may be partially performed together with the process of forming the cavity 220 while manufacturing the flexible printed circuit board 1000.

Meanwhile, as shown in FIG. 1, in the flexible region F1, an additional coverlay layer 510 for protecting the inner circuit layer 101 may be laminated on at least any one of the exposed surfaces of the inner board layer 100.

FIG. 2 is a flow diagram showing an example of a method of manufacturing a flexible printed circuit board. FIGS. 3-8 illustrates processes performed according to an example of a method of manufacturing a flexible printed circuit board according to the present disclosure.

Referring to FIGS. 2 to 8, an example of a method of manufacturing a flexible printed circuit board in accordance with the present disclosure starts with providing an inner board layer 100 (S100, FIG. 3).

In this example, the inner board layer 100 may be a laminated plate, such as a flexible copper clad laminate (FCCL), in which a copper foil is laminated on both faces of a polyimide-based first insulation layer 110. In addition, the inner board layer 100 may have an inner circuit layer 101 formed thereon by, for example, exposing and etching the copper foil laminated on both sides of the first insulation layer 110.

Figure 5:
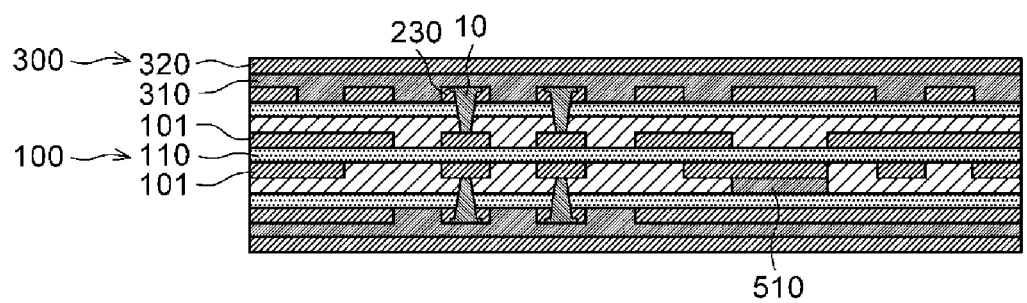

Next, a laminate 300, which is formed by having a coverlay layer 310 and a copper foil layer 320 laminated, is arranged and laminated on the inner board layer 100 in such a way that the coverlay layer 310 is oriented toward the inner board layer 100 (S200, FIG. 5).

Figure 4:
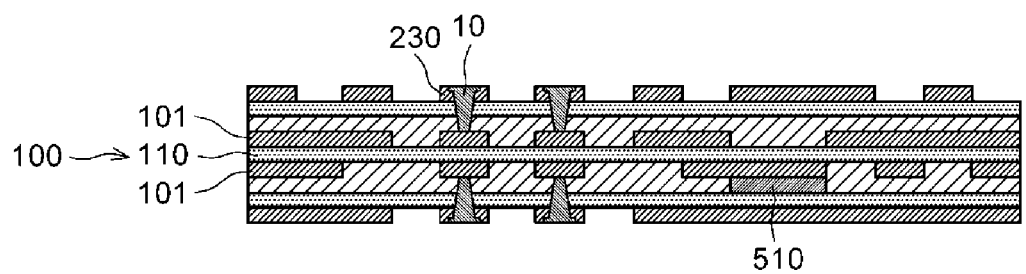

A second insulation layer 210 and an outer circuit layer 201 may be laminated on the inner board layer 100, as illustrated in FIG. 4, before the laminate 300 is laminated on an upper surface of the outer circuit layer 201, as illustrated in FIG. 5. However, the present disclosure is not limited to what is illustrated herein, and a variety of build-up processes, for example, skipping the process shown in FIG. 4, may be used depending on where a cavity 220 and a pad 230 are formed.

Meanwhile, the portion of the outer circuit layer 201 illustrated in FIG. 4 may be the pad 230 that is exposed through the cavity 220. In such a case, the pad 230 is a conductor portion that is electrically connected with an electronic device 400, which will be described later, and may be connected with the inner circuit layer 101 and/or the outer circuit layer 201 formed on another layer through, for example, a via 10.

The laminate 300 is laminated on a layer of rigid regions R1, R2 so as to be laminated on the pad 230 and may function as a solder resist for protecting the pad 230.

In one example, the coverlay layer 310 and the copper foil layer 320 are laminated to form a single modularized laminate 300, and the coverlay layer 310 of this laminate 300 is laminated so as to cover the pad 230.

Figure 6:
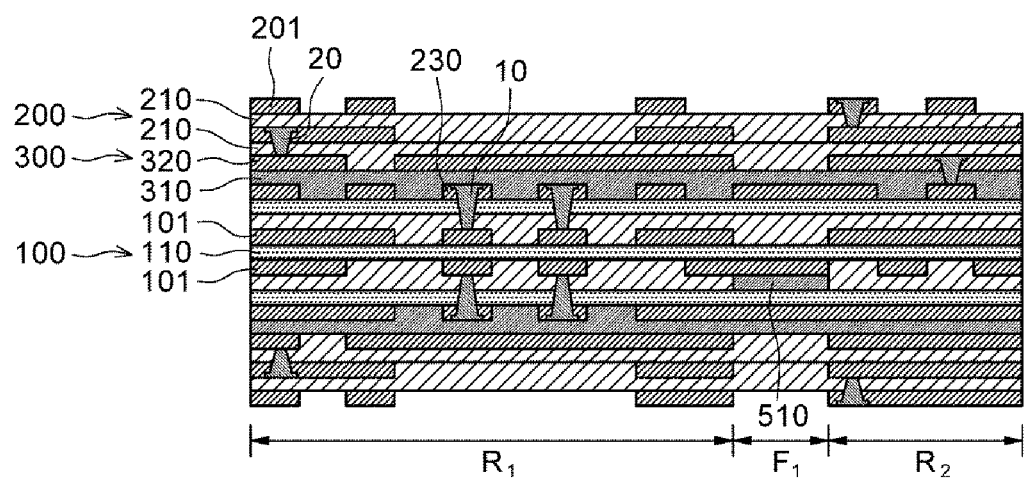

Then, an outer board layer 200 is laminated on the laminate 300 (S300, FIG. 6). According to one example, the outer board layer 200 is formed into a plurality of layers by coating an adhesive material and then compressing the second insulation layer 210, for example, a prepreg, and the copper foil repeatedly, forming a build-up layer in the rigid regions R1, R2.

In addition, the outer board layer 200 may have the outer circuit layer 201 formed therein by use of an etching process using photolithography or an additive process (plating process).

Figure 7:
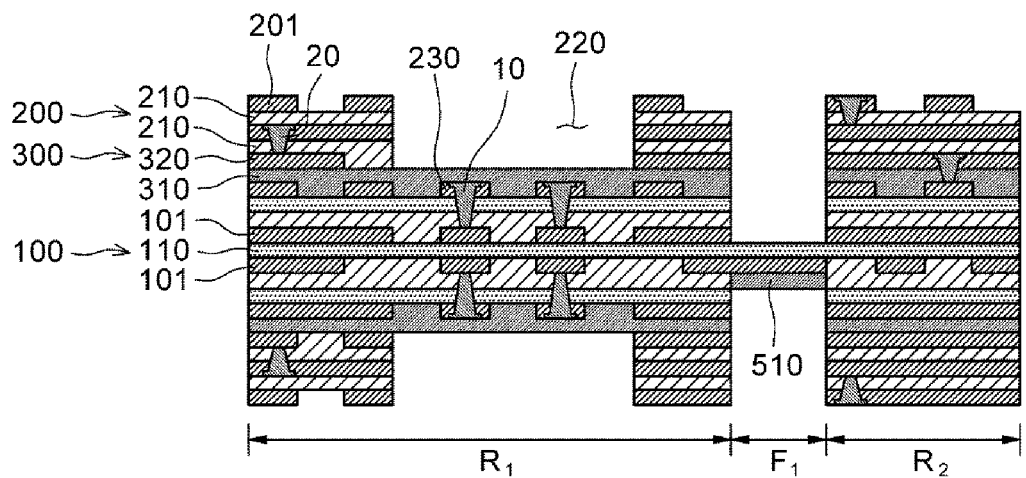

Next, the cavity 220 is formed by removing a portion of the outer board layer 200 in the rigid regions R1, R2 (S400, FIG. 7). In such a case, the cavity 220, which is a space for embedding the electronic device 400 installed in the outer board layer 200, may be formed by use of a punching technique using a CNC drill or a mold or a technique using a laser drill ($CO_2$ or YAG).

Afterwards, the pad 230 is exposed by removing a portion of the laminate 300 where the cavity 220 is formed (S600).

Figure 8:
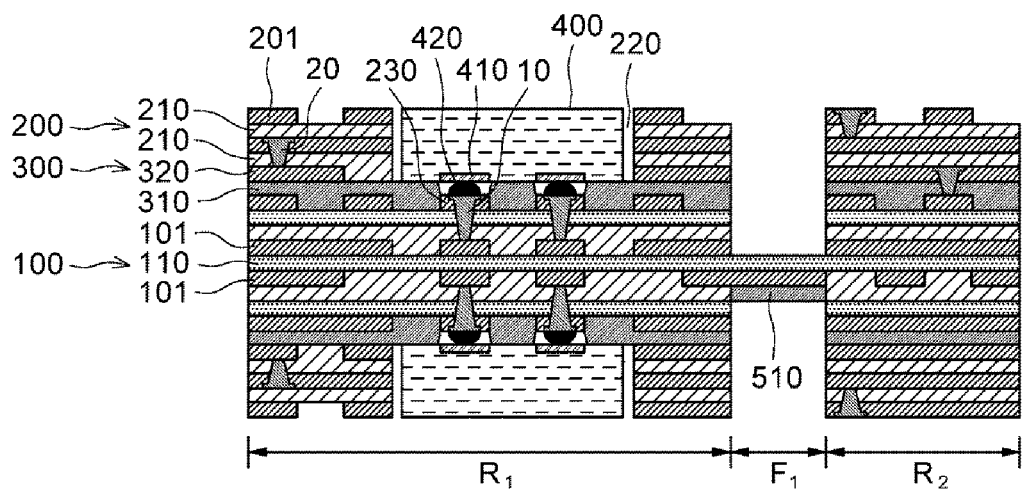

That is, the copper foil layer 320 at the portion of the laminate 300 where the cavity 220 is formed is removed, as illustrated in FIG. 7, and a portion of the coverlay layer 310 corresponding to a width of the pad 230 is removed so as to allow the pad 230 to be exposed, as illustrated in FIG. 8, and thus the electronic device 400 may be electrically connected to the pad 230.

As described above, an example of a method of manufacturing a flexible printed circuit board may involve using the modularized laminate 300 for one of the layers of the rigid regions R1, R2 to allow the laminate 300 to be laminated on the pad 230 exposed through the cavity 220; by using the modularized laminate 3000, the flexible printed circuit board may thus be manufactured in a simplified process.

In other words, by using the modularized laminate 300 for one of the layers of the rigid regions R1, R2 to laminate the laminate 300 on the pad 230 exposed through the cavity 220, additional processes of fabricating, tack-welding and molding may be skipped.

Moreover, as the modularized laminate 300 is used as a part of the build-up layer, the build-up layer may have an improved inter-layer matching and may be relatively thinner.

The method of manufacturing a flexible printed circuit board in accordance with the present example may further involve embedding the electronic device 400 in the cavity for electrical connection with the pad 230 (S700, FIG. 8), after the S600 step.

The electronic device 400, which is a portion that is embedded in the cavity 220 and is electrically connected with the pad 230, may be an active device, such as an IC chip, or a passive device, such as a capacitor and an inductor. The electronic device 400 may have a terminal formed thereon for electrical connection with the pad 230.

By forming the cavity 220 in a portion of the outer board layer 200 and mounting the electronic device 400 in the cavity 220, it is possible to manufacture a smaller and thinner electronic product using the flexible printed circuit board 1000 manufactured through the method of manufacturing a flexible printed circuit board in accordance with the present example.

According to an example of a method of manufacturing a flexible printed circuit board, the step of S400 may be performed by removing a portion of the outer board layer 200 through etching and laser processing by using a portion of the copper foil layer 320 of the laminate 300 as a laser mask.

For example, the copper foil that is arranged where the cavity 220 is to be formed while the outer board layer 200 is laminated may be pre-removed through etching. Accordingly, the portion where the cavity 220 is to be formed may already have the coverlay layer 310 covering the pad 230, the copper foil layer 320 laminated on the coverlay layer 310, and the second insulation layer 210 such as the prepreg laminated on the copper foil layer 320 formed therein.

In such a case, by removing the second insulation layer 210 through laser processing, the copper foil layer 320 functions as a laser mask. Thus, the second insulation layer 210 laminated above the copper foil layer 320 is removed to form the cavity 220.

Moreover, as described above, in order to expose the pad 230 through the cavity 220, the copper foil layer 320 at the portion where the cavity 220 is formed is removed through etching, and the portion of the coverlay layer 310 corresponding to a width of the pad 230 is removed so as to allow the pad 230 to be exposed.

Accordingly, since an example of a method of manufacturing a flexible printed circuit board in accordance with the present disclosure does not involve forming an additional laser resist layer, but may involve using a portion of the copper foil layer 320 as the laser mask, the flexible printed circuit board 1000 may be manufactured through a simplified process.

The example of the method of manufacturing a flexible printed circuit board may further involve forming a flexible region F1 so as to allow a portion of the inner board layer 100 to be exposed (S500, FIG. 7), after the step of S300.

That is, in the flexible region F1, the outer board layer 200 and the laminate 300 corresponding to the flexible region F1 are removed in order to form a structure in which the inner board layer 100 is exposed. Accordingly, the process of forming the flexible region F1 may be partially performed together with the process of forming the cavity 220.

Particularly, in the case where portions of the outer board layer 200 and the laminate 300 laminated on the inner board layer 100 are removed through etching and laser processing, it may be preferable that the process of forming the cavity 220 is performed at the same time at least partially.

That is, the copper foil of the outer board layer 200 and the copper foil layer 320 of the laminate 300 corresponding to the flexible region F1 may be partially removed at the time of etching while the cavity 220 is formed, and the second insulation layer 210 of the outer board layer 200 and the coverlay layer 310 of the laminate 300 may be partially removed at the time of laser processing while the cavity 220 is formed.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A flexible printed circuit board having a flexible region and a rigid region, comprising:
   an inner board layer;
   an outer board layer laminated on the inner board layer and having a cavity formed in the rigid region; and
   a laminate exposing a pad in the cavity and laminated on the inner board layer in the rigid region where the pad is formed,
   wherein the laminate comprises a coverlay layer and a copper foil layer arranged so that the coverlay layer faces the inner board layer, and
   wherein the laminate is continuously laminated throughout the layer of the rigid region.

2. The flexible printed circuit board of claim 1, further comprising an electronic device embedded in the cavity and electrically connected to the pad.

3. The flexible printed circuit board of claim 2, wherein the electronic device comprises a terminal formed at a portion thereof, and
   the terminal is electrically connected with the pad through a contact.

4. The flexible printed circuit board of claim 1, wherein the inner board layer comprises a first insulation layer and an inner circuit layer formed on at least one face of the first insulation layer, and
   the outer board layer comprises a second insulation layer laminated on the inner board layer and an outer circuit layer formed on the second insulation layer.

5. The flexible printed circuit board of claim 4, wherein the flexible region comprises at least a portion of the first insulation layer and at least a portion of the inner circuit layer.

6. The flexible printed circuit board of claim 1, wherein the coverlay layer comprises a polyimide film and a thermosetting adhesive.

7. The flexible printed circuit board of claim 1, wherein the cavity is formed by removing a portion of the outer board layer through etching and laser processing, and
   the laser processing is performed by using a portion of the copper foil layer of the laminate as a laser mask.

8. The flexible printed circuit board of claim 7, wherein the flexible region is formed by removing portions of the outer board layer laminated on the inner board layer and the laminate through etching and laser processing.

* * * * *